(12) United States Patent  
Kumar et al.

(10) Patent No.: US 9,075,947 B2  
(45) Date of Patent: Jul. 7, 2015

(54) INPUT/OUTPUT CELL DESIGN FOR THIN GATE OXIDE TRANSISTORS WITH RESTRICTED POLY GATE ORIENTATION

(71) Applicants: STMicroelectronics (Crolles 2) SAS, Crolles Cedex (FR); STMicroelectronics International N.V., Amsterdam (NL)

(72) Inventors: Manoj Kumar, Greater Noida (IN); Jean Guillorit, Crolles (FR); Navin Kumar Dayani, Gwalior (IN)

(73) Assignees: STMicroelectronics International N.V., Amsterdam (NL); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/911,224

(22) Filed: Jun. 6, 2013

(65) Prior Publication Data

US 2014/0365987 A1 Dec. 11, 2014

(51) Int. Cl.  
*G06F 17/50* (2006.01)

(52) U.S. Cl.  
CPC .................................. *G06F 17/5072* (2013.01)

(58) Field of Classification Search  
CPC ...................... H01L 27/11546; G06F 17/5072  
USPC ..................... 716/100, 55, 120, 110  
See application file for complete search history.

(56) References Cited

U.S. PATENT DOCUMENTS

| | | | | |
|---|---|---|---|---|
| 6,011,419 A * | 1/2000 | Nowak et al. | | 327/310 |
| 6,353,524 B1 * | 3/2002 | Sloan | | 361/111 |
| 6,953,956 B2 * | 10/2005 | Or-Bach et al. | | 257/203 |
| 7,105,871 B2 * | 9/2006 | Or-Bach et al. | | 257/203 |
| 7,205,823 B2 * | 4/2007 | Chen | | 327/534 |
| 7,397,296 B1 * | 7/2008 | Kiani | | 327/333 |
| 7,733,159 B1 * | 6/2010 | Camarota et al. | | 327/534 |
| 7,737,509 B2 * | 6/2010 | Ishibashi et al. | | 257/392 |
| 8,207,754 B2 | 6/2012 | Garg et al. | | |
| 8,878,387 B1 * | 11/2014 | Wong et al. | | 307/18 |
| 2004/0061524 A1 * | 4/2004 | Kumar et al. | | 326/81 |
| 2004/0119098 A1 * | 6/2004 | Or-Bach et al. | | 257/202 |
| 2004/0161878 A1 * | 8/2004 | Or-Bach et al. | | 438/113 |
| 2005/0167701 A1 * | 8/2005 | Or-Bach et al. | | 257/206 |
| 2006/0033124 A1 * | 2/2006 | Or-Bach et al. | | 257/202 |
| 2006/0134845 A1 * | 6/2006 | Pham et al. | | 438/200 |
| 2009/0273006 A1 * | 11/2009 | Chen et al. | | 257/173 |
| 2011/0260318 A1 * | 10/2011 | Eisenstadt | | 257/737 |
| 2012/0146118 A1 * | 6/2012 | Lee et al. | | 257/296 |
| 2015/0061756 A1 * | 3/2015 | Sewani et al. | | 327/538 |

* cited by examiner

*Primary Examiner* — Suchin Parihar  
(74) *Attorney, Agent, or Firm* — Gardere Wynne Sewell LLP (57) ABSTRACT

An input/output circuit layout has a first section in which first transistors having a thicker gate oxide are located and a second section in which second transistors having a thinner gate oxide are located. Due to process technology constraints, the gates of all of the second transistors are oriented in a single common direction. The second section has a perimeter having a square shape including a first edge and a second edge adjacent to the first edge. First connection pins coupled to the second transistors are provided with an orientation that extends inwardly from and perpendicular to the first edge. Second connection pins coupled to the second transistors are provided with an orientation that extends inwardly from and perpendicular to said second edge. The square shape and presence of pins on adjacent first and second edges permits rotation of the second section to fit within different orientations of the layout.

22 Claims, 7 Drawing Sheets

INPUT/OUTPUT CELL DESIGN FOR THIN GATE OXIDE TRANSISTORS WITH RESTRICTED POLY GATE ORIENTATION

TECHNICAL FIELD

The present invention relates to a cell or block design for semiconductor integrated circuit input/output (I/O) circuitry and in particular to the cell or block design for circuits utilizing thin gate oxide transistors in I/O circuitry having a mixture of thin gate oxide transistors and thick gate oxide transistors.

BACKGROUND

Figure 1:
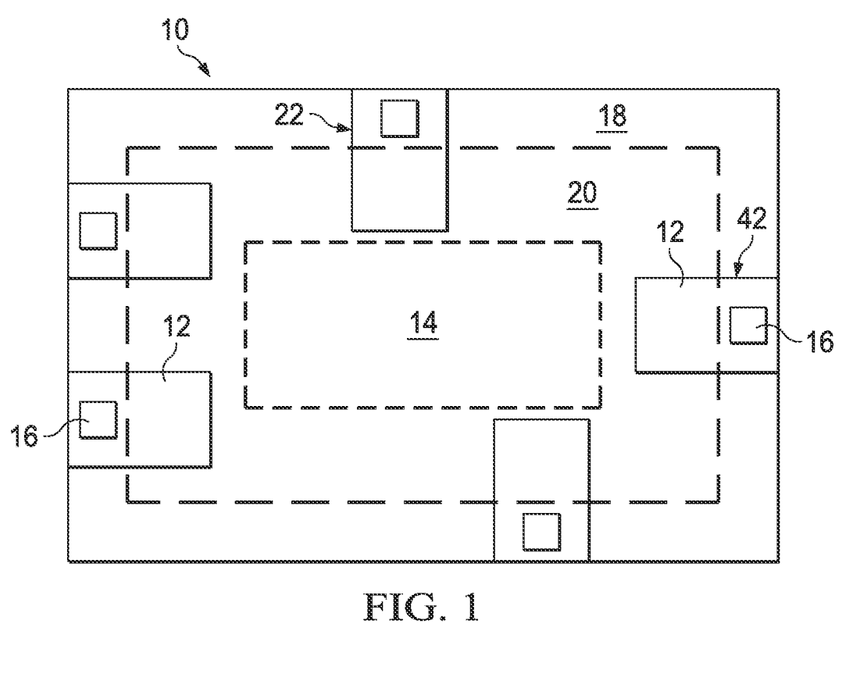
FIG. 1 is a block diagram for an integrated circuit including input/output (I/O) circuitry.

Reference is made to FIG. 1 which illustrates a block diagram for an integrated circuit 10 including a plurality of input/output (I/O) circuits 12. The integrated circuit 10 includes a core circuit 14 which is generally speaking located at or near the center of the integrated circuit die. The I/O circuits 12 are provided surrounding the core circuit 14 in a peripheral ring. Each I/O circuit 12 may be associated with at least one input/output pad 16 of the integrated circuit 10.

It is common for the core circuit 14 to be powered at a first power supply voltage and for portions of the I/O circuits 12 to be powered at a second power supply voltage, wherein the second power supply voltage is higher than the first power supply voltage. As an example, the core circuit may be powered from a 1.2 Volt power supply while portions of the I/O circuits may be powered from a 2.5 Volt power supply. The first and second power supply voltages may be supplied external to the integrated circuit at corresponding power supply pads. Alternatively, the higher second power supply voltage may be supplied external to the integrated circuit at one or more power supply pads, while the lower first power supply voltage is generated from the higher second power supply voltage using a DC-to-DC power converter circuit provided on the integrated circuit 10.

Each I/O circuit 12 provides connectivity between the core circuit 14 and the external environment (represented by the pad 16). In accordance with that connectivity, each I/O circuit 12 implements various sub-blocks performing specific functions associated with an "input" or "output" operation.

For an "input" configured I/O circuit 12, an input buffer is coupled to the pad 16 to receive a signal from the external environment. This input buffer is designed to operate at the higher second power supply voltage. The output of the input buffer is coupled to a high-to-low level shifter circuit. This level shifter circuit is designed to operate at both the higher second power supply voltage and the lower first power supply voltage. The output of the level shifter circuit is coupled to a core interface circuit. This core interface circuit is designed to operate at the lower first power supply voltage (same as used by the core circuit) and deliver the level shifted external signal to the core circuit.

For an "output" configured I/O circuit 12, a core interface circuit is coupled to the core circuit 10 to receive a signal from the core. This core interface circuit is designed to operate at the lower first power supply voltage (same as that used by the core circuit). The output of the core interface circuit is coupled to a low-to-high level shifter circuit. This level shifter circuit is designed to operate at both the lower first power supply voltage and the higher second power supply voltage. The output of the level shifter circuit is coupled to an output buffer. This output buffer is designed to operate at the higher second power supply voltage. The pad 16 is coupled to the output of the output buffer to deliver the level shifted core signal to the external environment.

To support operation at both the lower first power supply voltage and the higher second power supply voltage, it is common for the design of the I/O circuit 12 to utilize transistors having different gate oxide thicknesses. More specifically, transistors with thinner gate oxides are used for the circuitry powered from the lower first power supply voltage, while transistors with thicker gate oxides are used for the circuitry powered from the higher second power supply voltage. As the core circuit 14 is also powered from the lower first power supply voltage, it will also typically use transistors with thinner gate oxides. In an exemplary implementation, the transistors with thinner gate oxides may be formed using a single layer gate oxide (referred to in the art as a GO1-type transistor) and the transistors with thicker gate oxides may be formed using a double layer gate oxide (referred to in the art as a GO2-type transistor).

The core interface circuits of the I/O circuit 12 are accordingly powered solely from the lower first power supply voltage and are built from single layer gate oxide (GO1) transistors. The input/output buffer circuits of the I/O circuit 12 are accordingly powered solely from the higher second power supply voltage and are built from double layer gate oxide (GO2) transistors. The level shifter circuits of the I/O circuit 12 are accordingly powered from both the lower first power supply voltage and the higher second power supply voltage and are built from a mixture of single layer gate oxide (GO1) transistors and double layer gate oxide (GO2) transistors.

For an I/O circuit 12, the single layer gate oxide (GO1) transistors (used in the core interface circuits and level shifter circuits) are positioned closer to the core circuit 14, while the double layer gate oxide (GO2) transistors (used in the buffer circuits and level shifter circuits) are positioned closer to the pad 16.

As the process technology continues to shrink, there is a corresponding decrease in the length dimension of the transistor gate. For example, gate lengths are at or approaching 20-30 nm and are expected to continue to shrink. This presents a significant photolithographic challenge to semiconductor integrated circuit fabrication. Indeed, there are recognized by those skilled in the art a number of constraints imposed on transistor layout design. One known constraint arising from decreasing transistor gate length is that the gates of the included transistors within a given block of the transistor layout must be oriented in a single critical dimension in order to achieve a tightest possible control over line width. This restriction for use of a single orientation for the transistor gates significantly adds to the complexity of designing the layout of circuitry such as the I/O circuit 12 discussed above.

As shown in FIG. 1, an I/O circuit 12 may possess a cell or block layout that is generally of a rectangular shape. The shorter edges of the layout generally face the peripheral edge of the integrated circuit 10 and the core circuit 14, respectively. The area of the integrated circuit 10 surrounding the core circuit 14 in which the I/O circuits 12 are located is generally referred to in the art as the I/O ring 18. Power supply rails (shown generally by dotted line 20) for the integrated circuit 10 are also typically positioned in the I/O ring in a manner which encircles the core circuit 14. When designing the I/O ring 18 and its included I/O circuit 12 and power supply rails 20, the layout designer must account for the fact that the cell or block layouts for the I/O circuits 12 need to be placed in both the vertical direction (as shown at the top and bottom edges of the integrated circuit 10) and the horizontal direction (as shown at the left and right edges of the integrated circuit 10).

Figure 2A:
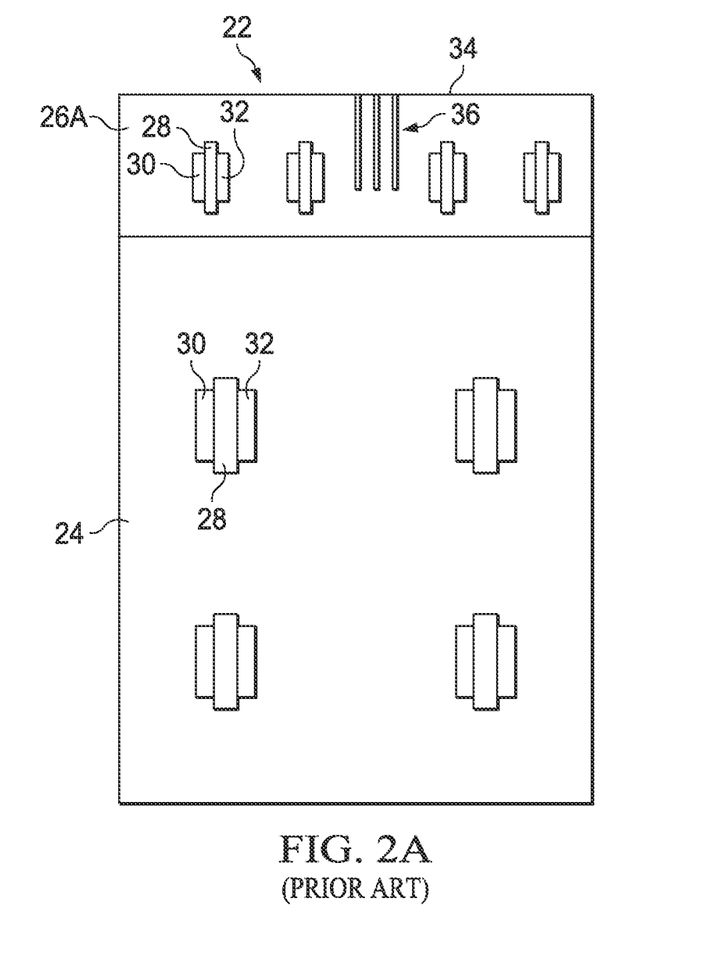
FIG. 2A illustrates a schematic representation of a vertically oriented input/output (I/O) block for an I/O circuit.
Figure 2B:
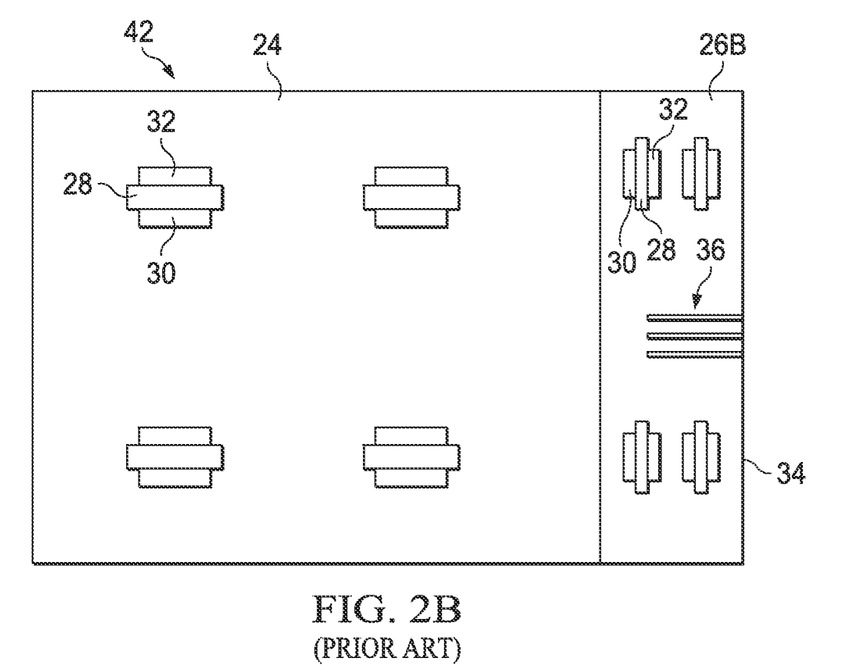
FIG. 2B illustrates a schematic representation of a horizontally oriented input/output (I/O) block for an I/O circuit.

Reference is now made to FIG. 2A which illustrates a schematic representation of the cell or block layout for a vertically oriented input/output (I/O) block 22 for the I/O circuit 12 and FIG. 2B which illustrates a schematic representation of the cell or block layout for a horizontally oriented input/output (I/O) block 42 for the I/O circuit 12. The blocks 22 and 42 each include a first rectangular section 24 in which the transistors with thicker gate oxides (GO2) powered from the higher second power supply voltage are located. Blocks 22 and 42 further include a second rectangular section 26A and 26B, respectively, in which the transistors with thinner gate oxides (GO1) powered from the lower first power supply voltage are located. It will be noted that the rectangular shape of the first section 24 is oriented perpendicular to the rectangular shape of the second sections 26A/26B. Each included transistor (GO1 or GO2) within the I/O circuit 12 has a poly gate 28 and adjacent source and drain regions 30 and 32, respectively. It will be noted that the transistors with thinner gate oxides (GO1) have a gate 28 length which is generally smaller than the gate length of the transistors with thicker gate oxides (GO2).

As a result of the photolithographic challenges described above, the transistors within a given section of the layout, and in particular within the second rectangular section 26A and 26B, must have a single orientation for the transistor gate 28. Thus, FIG. 2A shows that the transistors with thinner gate oxides (GO1) in the second rectangular section 26A are all oriented with their gate 28 widths extending in a direction perpendicular to the edge 34 (i.e., with their gate lengths extending parallel to the edge 34). The transistors with thicker gate oxides (GO2) in the first rectangular section 24 are likewise oriented in this example. Conversely, FIG. 2B shows that the transistors with thinner gate oxides (GO1) in the second rectangular section 26B are all oriented with their gate 28 widths extending in a direction parallel to the edge 34 (i.e., with their gate lengths extending perpendicular to the edge 34). The transistors with thicker gate oxides (GO2) in the first rectangular sections 24 are oriented, for example, with their gate 28 widths extending in a direction perpendicular to the edge 34 (i.e., with their gate lengths extending parallel to the edge 34).

The edge 34 of each block 22 and 42 is the edge positioned closest to the core circuit 14 (see, FIG. 1). Connectivity pins (also referred to a connectivity lines or leads) 36 are provided in the layout of the second rectangular sections 26A and 26B to make electrical connection to terminals of the included transistors with thinner gate oxides (GO1), for example, connecting to the sources/drains of the GO1 transistors in an output configured I/O circuit or connecting to the gates of the GO1 transistors in an input configured I/O circuit. These connectivity pins are provided to support an electrical connection between the core interface circuit within the I/O circuit 12 and the core circuit 14 of the integrated circuit 10. The connectivity pins 36 are accordingly oriented in a manner which extends perpendicular to the edge 34 and in the direction of the core circuit 14.

A comparison of FIG. 2A to FIG. 2B reveals that support of both a vertically oriented input/output (I/O) block 22 and a horizontally oriented input/output (I/O) block 42 for the I/O circuit 12 requires the layout designer to design two different layouts for the second rectangular sections 26A and 26B due to the limitations on gate orientation and the provision of the connectivity pins at the edge 34. More specifically, the layout designed must provide a design for the second rectangular section 26A specifically for use with a vertically oriented input/output (I/O) block 22, and provide a different design for the second rectangular section 26B specifically for use with a horizontally oriented input/output (I/O) block 42. This is not an efficient solution for integrated circuit design.

A need accordingly exists in the art for a more efficiently designed layout for integrated circuit I/O circuitry, and an in particular for a more efficiently designed and universally useful layout for the section including transistors with thinner gate oxides (GO1) that make electrically connection to core circuits.

SUMMARY

In an embodiment, an input/output circuit layout for an integrated circuit comprises: a first section in which first transistors powered from a higher supply voltage and having a thicker gate oxide are located; a second section in which second transistors powered from a lower supply voltage and having a thinner gate oxide are located; wherein said second section includes at least one layout section having a square shaped perimeter including a first edge and a second edge adjacent to the first edge and including second transistors with transistor gates oriented in a single common direction; and wherein said at least one layout section further includes: one or more first connection pins coupled to said second transistors and which are oriented to extend inwardly from and perpendicular to said first edge; and one or more second connection pins coupled to said second transistors and which are oriented to extend inwardly from and perpendicular to said second edge.

In an embodiment, a multi-directional plug-in for an integrated circuit input/output (I/O) layout comprises: a square shaped perimeter including a first edge and a second edge adjacent to the first edge; a plurality of transistors located within the square perimeter, said transistors having transistor gates oriented in a single common direction; a first connection pin coupled to said transistors and which is oriented to extend inwardly from and perpendicular to said first edge; and a second connection pin coupled to said transistors and which is oriented to extend inwardly from and perpendicular to said second edge.

In an embodiment, an input/output circuit layout for an integrated circuit comprises: a first section including transistors powered from a higher supply voltage and having a thicker gate oxide; a second section supporting insertion of at least one multi-directional plug-in in at least two different orientations, said plug-in having a square shaped perimeter including a first edge and a second edge adjacent to the first edge and including transistors powered from a lower supply voltage and having a thinner gate oxide, wherein all transistors in said second section have transistor gates oriented in a single common direction; said at least two different orientations being supported by: at least one first connection pin coupled to said transistors of the plug-in and oriented to extend inwardly from and perpendicular to said first edge; and at least one second connection pin coupled to said transistors of the plug-in and oriented to extend inwardly from and perpendicular to said second edge.

In an embodiment, a multi-directional plug-in insertable into an integrated circuit input/output (I/O) layout at least two different orientations comprises: a square shaped perimeter including a first edge and a second edge adjacent to the first edge and including transistors, wherein all transistors within said square shaped perimeter have transistor gates oriented in a single common direction; said at least two different orientations being supported by: at least one first connection pin coupled to said transistors and oriented to extend inwardly from and perpendicular to said first edge; and at least one second connection pin coupled to said transistors and oriented to extend inwardly from and perpendicular to said second edge.

BRIEF DESCRIPTION OF THE DRAWINGS

For a better understanding of the embodiments, reference will now be made by way of example only to the accompanying figures in which:

FIG. 3C illustrates a schematic representation of a multi-directional plug-in;

FIG. 4 illustrates a corner positioning of the multi-directional plug-in;

FIG. 5 illustrates a metallization configuration for the multi-directional plug-in.

DETAILED DESCRIPTION OF THE DRAWINGS

Figure 3A:
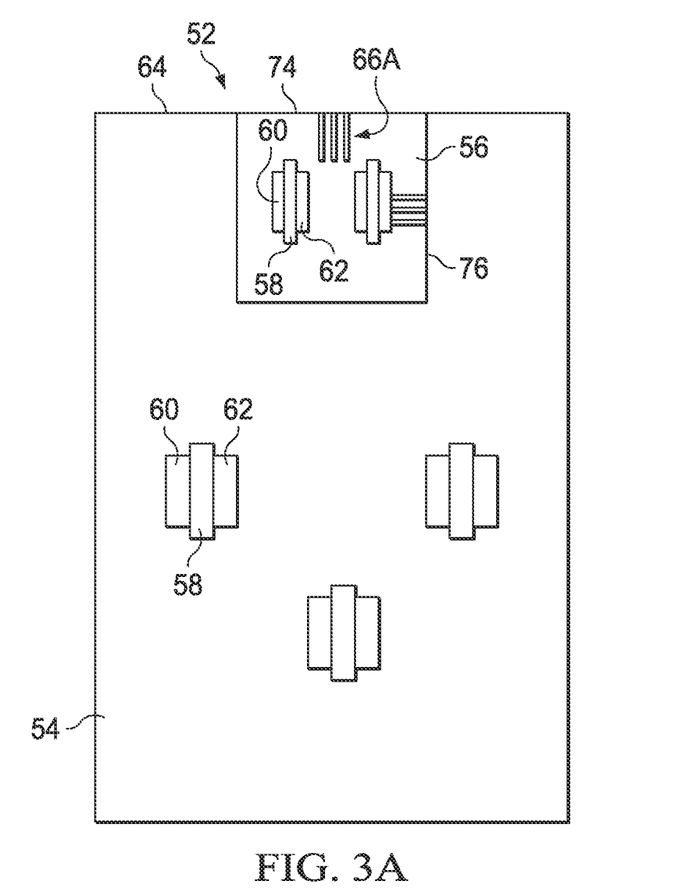
FIG. 3A illustrates a schematic representation of a vertically oriented input/output (I/O) block for an I/O circuit.
Figure 3B:
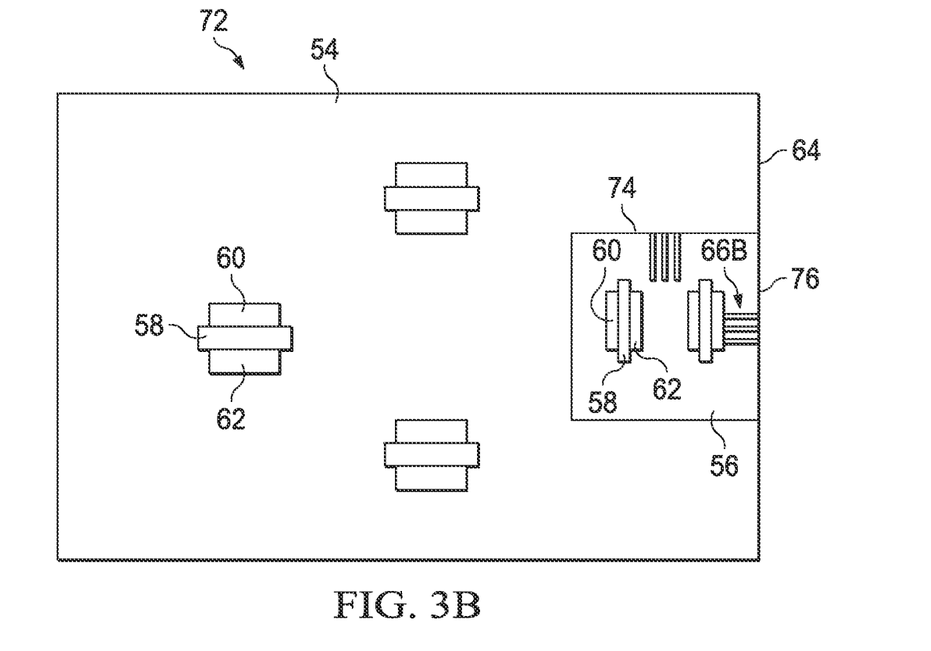
FIG. 3B illustrates a schematic representation of a horizontally oriented input/output (I/O) block for an I/O circuit.

Reference is now made to FIG. 3A which illustrates a schematic representation of a cell or block layout for a vertically oriented input/output (I/O) block 52 for the I/O circuit 12 and FIG. 3B which illustrates a schematic representation of a cell or block layout for a horizontally oriented input/output (I/O) block 72 for the I/O circuit 12. The blocks 52 and 72 each include a first section 54 in which the transistors with thicker gate oxides (GO2) powered from the higher second power supply voltage are located. Blocks 52 and 72 each further include a second square section 56 in which the transistors with thinner gate oxides (GO1) powered from the lower first power supply voltage are located. Each included transistor (GO1 or GO2) has a poly gate 58 and adjacent source and drain regions 60 and 62, respectively. It will be noted that the transistors with thinner gate oxides (GO1) have a gate 58 length which is smaller than the gate length of the transistors with thicker gate oxides (GO2).

As a result of the photolithographic challenges described above, the transistors within a given section or sub-section of the layout must have a single orientation for the transistor gate 58. Thus, FIGS. 3A and 3B each show that the transistors with thicker gate oxides (GO2) in the first sections 54 are oriented, for example, with their gate 58 widths extending in a direction perpendicular to the edge 64 (i.e., with their gate lengths extending parallel to the edge 64).

Rather than providing two different layout designs for the sections including transistors with thinner gate oxides (GO1) to account for the horizontal and vertical orientation of the input/output (I/O) block (see, in comparison, the prior art solution of FIGS. 2A and 2B), the square shape of the second square section 56 shown in FIGS. 3A and 3B advantageously supports a multi-directional plug-in for a cell or block that permits a single layout design to be implemented for different block orientations, with the second square section 56 simply rotated ninety-degrees as needed to provide the desired gate orientation while still maintaining necessary connectivity to core circuit 14.

Figure 3C:
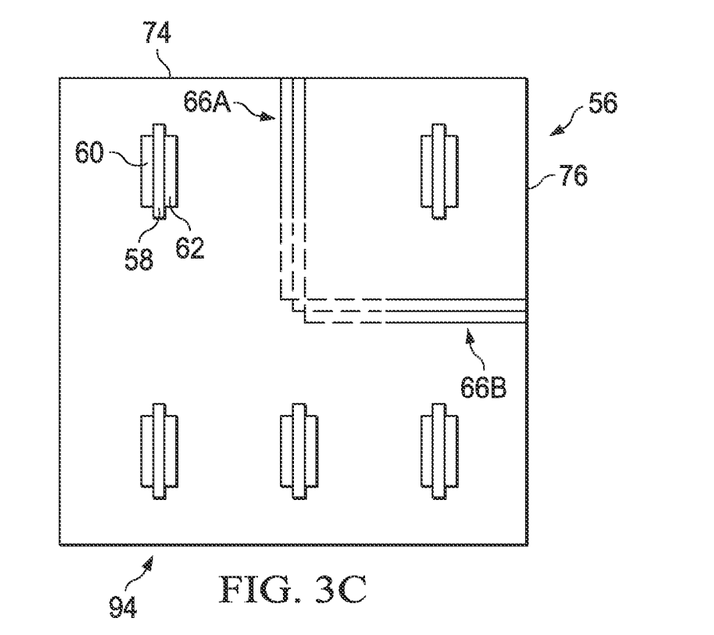

The transistors with thinner gate oxides (GO1) in the second square section 56 are all oriented in a same direction of the multi-directional plug-in (see, FIG. 3C). For example, the transistors with thinner gate oxides (GO1) are oriented with their gate 58 widths extending in a direction perpendicular to a first edge 74 (i.e., with their gate lengths extending parallel to the first edge 74). The second square section 56 further includes a second edge 76 which is adjacent the first edge 74.

First and second connectivity pins (also referred to a connectivity lines or leads) 66A and 66B, respectively, are provided in the layout of the second square section 56 of the multi-directional plug-in to make electrical connection to the terminals (sources, drains and/or gates) of transistors with thinner gate oxides (GO1). The first connectivity pins 66A are oriented in a manner which extends perpendicular to the first edge 74. The second connectivity pins 66B are oriented in a manner which extends perpendicular to the second edge 76.

Corresponding ones of the first and second connectivity pins 66A and 66B are connected to each other (as illustrated by the dotted line connection) and the connected pins have corresponding edge locations. By this it is meant that the relative location along an edge of the square section 56 and the particular order of the pins along that edge are the same for both the first edge 74 and the second edge 76.

With a vertically oriented input/output (I/O) block 52 for the I/O circuit 12, as shown in FIG. 3A, the second square section 56 is configured, for example, with the first edge 74 coincident with the edge 64 of the block 52 so that the first set of connectivity pins 66A are provided with an orientation in the direction of the core circuit 14. With a horizontally oriented input/output (I/O) block 72 for the I/O circuit 12, as shown in FIG. 3B, the second square section 56 is configured, for example, with the second edge 76 coincident with the edge 64 of the block 52 so that the second set of connectivity pins 66B are provided with an orientation in the direction of the core circuit 14.

Thus, the second square section 56 for the transistors with thinner gate oxides (GO1) has a layout wherein all included transistors have a same gate orientation and connectivity pins 66A/66B to support connection to the core circuit 14 of the integrated circuit are provided in two orthogonal directions associated with two adjacent edges of the square shape. In this way, the square shaped section 56 presents an easy multi-directional plug-in for the layout designer to use in designing vertically and/or horizontally oriented input/output (I/O) blocks for an I/O circuit 12. The prior art need to design two different plug-ins (26A and 26B) for the sections supporting transistors with thinner gate oxides (GO1) is accordingly obviated.

Figure 4:
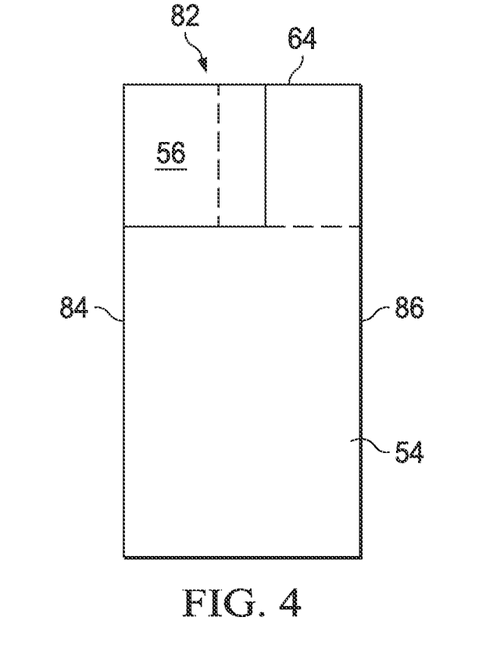

Reference is now made to FIG. 4 which illustrates a schematic representation of a (vertically or horizontally oriented) input/output (I/O) block 82 for the I/O circuit 12 where the layout has positioned the square shaped section 56 in a corner at the intersection of the edge 64 and a side edge 84. This is different from the relatively centered position along the edge 64 as shown in FIGS. 3A and 3B. It will be understood that the square shaped section 56 could instead be positioned in the opposite corner at the intersection of the edge 64 and the opposite side edge 86 (as shown by the dotted line). The first section 54 in which the transistors with thicker gate oxides (GO2) are located is thus provided with an "L"-shaped configuration. In each case, however, the included square shaped section 56 can be rotated as desired to provide the needed connectivity outside of the I/O circuit, including (if needed) connectivity at the side edges 84 and 86.

Figure 5:
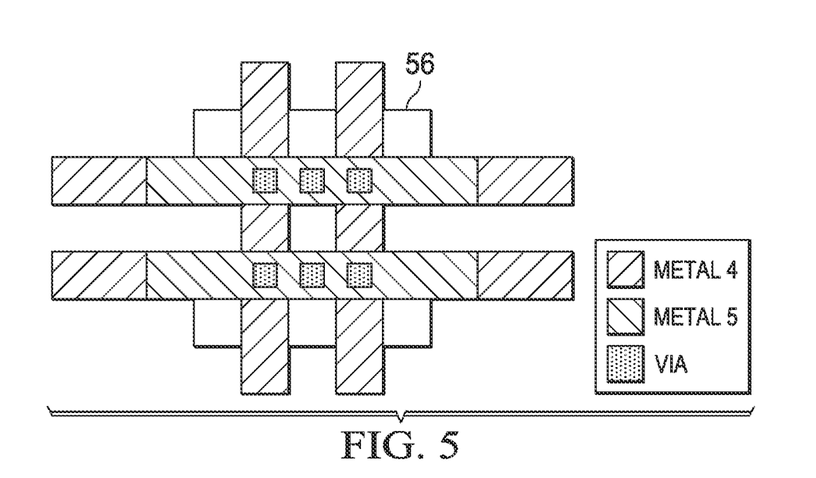

Reference is now made to FIG. 5 which illustrates a metallization configuration for the multi-directional plug-in of the square shaped section 56. As discussed in connection with FIG. 1, the integrated circuit includes power supply rails associated with the I/O ring. These rails are provided in upper metallization levels of the integrated circuit. For example, metal 4 and metal 5 may be used for the power supply rails. The metallization for the square shaped section 56 is positioned in a manner to support each of the desired plug-in orientations without requiring a metallization design that is unique to each plug-in orientation. This is shown, in an exemplary manner, in FIG. 5 with the configuration of the metal 4 and metal 5 layers of the integrated circuit metallization. The rotation of the square shaped section 56 ninety-degrees does not change relative positioning of the included vias and location of the running metal lines.

The use of a single multi-directional plug-in for an input/output (I/O) block as shown in FIGS. 3A, 3B and 4 with a square shape may not present the most efficient use of the available rectangular area within the I/O block. Indeed, with reference to prior art FIG. 2A, the most efficient use of available area may necessitate a rectangular area for supporting transistors with thinner gate oxides (GO1) at the edge 34 of the block. However, such a rectangular area, as discussed above, presents design problems when having to be used with both horizontally and vertically oriented layouts because two different designs of the layout, one for vertical and one for horizontal, must be made.

Figure 6:
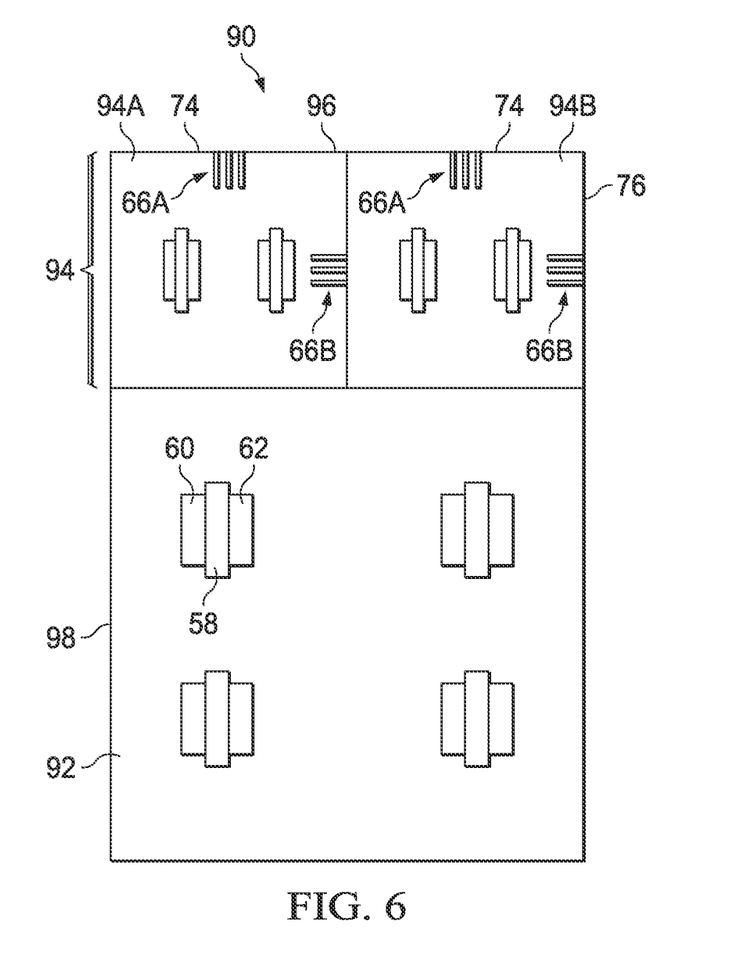
FIG. 6 illustrates the use of multiple multi-directional plug-ins in an input/output (I/O) block for an I/O circuit.

Reference is now made to FIG. 6 which illustrates the use of multiple multi-directional plug-ins in an input/output (I/O) block 90 for an I/O circuit. The block 90 includes a first rectangular section 92 in which the transistors with thicker gate oxides (GO2) powered from the higher second power supply voltage are located. Block 90 further include a second rectangular section 94 in which the transistors with thinner gate oxides (GO1) powered from the lower first power supply voltage and oriented in a common direction are located. However, the second rectangular section 94 is divided into at least two square sub-sections 94A and 94B, each including transistors with thinner gate oxides (GO1). Each included transistor (GO1 or GO2) has a poly gate 58 and adjacent source and drain regions 60 and 62, respectively. It will be noted that the transistors with thinner gate oxides (GO1) have a gate 58 length which is smaller than the gate length of the transistors with thicker gate oxides (GO2).

As a result of the photolithographic challenges described above, the transistors within a given section or sub-section of the layout must have a single orientation for the transistor gate 58. Thus, FIG. 6 shows that the transistors with thicker gate oxides (GO2) in the first section 92 are oriented, for example, with their gate 58 widths extending in a direction perpendicular to the edge 96 (i.e., with their gate lengths extending parallel to the edge 98).

The square shapes of the two or more included sub-sections 94A and 94B advantageously supports a multi-directional plug-in cell or block that permits a single layout design to be implemented for different I/O block orientations, with the two or more second square sections 94 simply rotated ninety-degrees as needed to provide the desired GO1 gate orientation while still maintaining necessary connectivity to core circuit 14 (and perhaps to other circuitry if needed).

The transistors with thinner gate oxides (GO1) in each of the second square sub-sections 94A and 94B are all oriented in a same direction of the multi-directional plug-in (see, FIG. 3C). For example, the transistors with thinner gate oxides (GO1) are oriented with their gate 58 widths extending in a direction perpendicular to a first edge 74 (i.e., with their gate lengths extending parallel to the first edge 74). Each second square sub-section 94A and 94B further includes a second edge 76 which is adjacent the first edge 74.

First and second connectivity pins (also referred to a connectivity lines or leads) 66A and 66B, respectively, are provided in the layout of the second square sub-sections 94A and 94B of the multi-directional plug-in to make electrical connection to the terminals (sources, drains and/or gates) of transistors with thinner gate oxides (GO1). The first connectivity pins 66A are oriented in a manner which extends perpendicular to the first edge 74. The second connectivity pins 66B are oriented in a manner which extends perpendicular to the second edge 76.

Corresponding ones of the first and second connectivity pins 66A and 66B are connected to each other (as illustrated by the dotted line connection of FIG. 3C) and the connected pins have corresponding edge locations. By this it is meant that the relative location along an edge of the square sub-sections 94A and 94B and the particular order of the pins along that edge are the same for both the first edge 74 and the second edge 76.

By using two or more square sub-sections as described to fill a rectangular area of the layout, an optimization of area usage in the layout can be obtained while still maintaining the advantage of designing and using a single layout for transistors with thinner gate oxides (GO1).

With a vertically oriented input/output (I/O) block for the I/O circuit, as shown in FIG. 6, each of the second square sub-sections 94A and 94B is configured, for example, with the first edge 74 coincident with the edge 96 so that the first set of connectivity pins 66A are provided with an orientation in the direction of the core circuit 14. With a horizontally oriented input/output (I/O) block for the I/O circuit (not shown), the second square sub-sections 94A and 94B are configured, for example, with the second edge 76 coincident with the edge 96 so that the second set of connectivity pins 66B are provided with an orientation in the direction of the core circuit 14.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit including an input/output circuit, comprising:
    a first section in which first transistors powered from a higher supply voltage and having a first thickness gate oxide are located;
    a second section in which second transistors powered from a lower supply voltage and having a second thickness gate oxide, thinner than the first thickness, are located;
    wherein said second section includes at least one layout section having a square shaped perimeter including a first edge and a second edge adjacent to the first edge and including second transistors with transistor gates oriented in a single common direction; and
    wherein said at least one layout section further includes:
        a plurality of first connection pins coupled to said second transistors and which are oriented to extend inwardly from and perpendicular to said first edge; and a plurality of second connection pins coupled to said second transistors and which are oriented to extend inwardly from and perpendicular to said second edge.

2. The integrated circuit of claim 1, wherein said first and second sections are contained within a rectangular region having an edge and wherein said first edge of the at least one layout section is coincident with the edge of the rectangular region.

3. The integrated circuit of claim 2, wherein said first connection pins at said first edge are configured to make an electrical connection with core circuitry of the integrated circuit.

4. The integrated circuit of claim 1, wherein said first and second section are contained within a rectangular region having an edge and wherein said second edge of the at least one layout section is coincident with the edge of the rectangular region.

5. The integrated circuit of claim 4, wherein said second connection pins at said second edge are configured to make an electrical connection with core circuitry of the integrated circuit.

6. The integrated circuit of claim 1, wherein an order and relative position of the first connection pins on the first edge corresponds to an order and relative position of the second connection pins on the second edge.

7. The integrated circuit of claim 1, wherein said second section has a rectangular shape and includes two or more of said layout sections having a square shaped perimeter positioned adjacent to each other.

8. An integrated circuit including a multi-directional plug-in circuit for an integrated input/output (I/O) circuit, comprising:
 a square shaped perimeter including a first edge and a second edge adjacent to the first edge;
 a plurality of transistors located within the square perimeter, said transistors having transistor gates oriented in a single common direction;
 a plurality of first connection pins coupled to said transistors and which is oriented to extend inwardly from and perpendicular to said first edge to support electronic connection of the transistors to the I/O circuit when said plug-in circuit is oriented in a first orientation; and
 a plurality of second connection pins coupled to said transistors and which is oriented to extend inwardly from and perpendicular to said second edge to support electronic connection of the transistors to the I/O circuit when said plug-in circuit is oriented in a second orientation that is ninety-degrees offset from said first orientation.

9. The integrated circuit of claim 8, wherein the plug-in circuit is configured for use in the integrated circuit input/output (I/O) layout in the first orientation wherein the first edge faces a core circuitry and the first connection pins are used to make connection to said core circuitry and the second orientation wherein the second edge faces said core circuitry and the second connection pins are used to make connection to said core circuitry.

10. The integrated circuit of claim 8, wherein said plurality of transistors located within the square perimeter are thin oxide transistors powered from a low voltage supply.

11. The integrated circuit of claim 8, wherein an order and relative position of the first connection pins on the first edge corresponds to an order and relative position of the second connection pins on the second edge.

12. An integrated circuit including an input/output circuit, comprising:

a first section including transistors powered from a higher supply voltage and having a first thickness gate oxide;
a second section supporting insertion of at least one multi-directional plug-in circuit in at least two different orientations, said plug-in circuit having a square shaped perimeter including a first edge and a second edge adjacent to the first edge and including transistors powered from a lower supply voltage and having a second thickness gate oxide, thinner than the first thickness, wherein all transistors in said second section have transistor gates oriented in a single common direction;
said at least two different orientations being supported by:
 a plurality of first connection pins coupled to said transistors of the plug-in circuit and oriented to extend inwardly from and perpendicular to said first edge; and
 a plurality of second connection pins coupled to said transistors of the plug-in circuit and oriented to extend inwardly from and perpendicular to said second edge.

13. The integrated circuit of claim 12, wherein said first and second sections are contained within a rectangular region having an edge and wherein said first edge of the plug-in circuit is coincident with the edge of the rectangular region when the plug-in circuit is inserted into the second section with a first one of said at least two different orientations.

14. The integrated circuit of claim 13, wherein said first connection pins at said first edge are configured to make an electrical connection with core circuitry of circuit integrated circuit.

15. The integrated circuit of claim 12, wherein said first and second sections are contained within a rectangular region having an edge and wherein said second edge of the plug-in circuit is coincident with the edge of the rectangular region when the plug-in circuit is inserted into the second section with a second one of said at least two different orientations.

16. The integrated circuit of claim 15, wherein said second connection pins at said second edge are configured to make an electrical connection with core circuitry of the integrated circuit.

17. The integrated circuit of claim 12, wherein an order and relative position of the first connection pins on the first edge corresponds to an order and relative position of the second connection pins on the second edge.

18. The integrated circuit of claim 12, wherein said second section has a rectangular shape and includes two or more of said square shaped multi-directional plug-in circuits positioned adjacent to each other.

19. An integrated multi-directional plug-in circuit for an input/output (I/O) circuit configured for connection in at least two different orientations, comprising:
 a square shaped perimeter including a first edge and a second edge adjacent to the first edge and including transistors, wherein all transistors within said square shaped perimeter have transistor gates oriented in a single common direction;
 said at least two different orientations being supported by:
  a plurality of first connection pins coupled to said transistors and oriented to extend inwardly from and perpendicular to said first edge; and
  a plurality of second connection pins coupled to said transistors and oriented to extend inwardly from and perpendicular to said second edge.

20. The integrated multi-directional plug-in circuit of claim 19, configured for connection in the input/output (I/O) circuit in a first orientation wherein the first edge faces a core circuitry and the first connection pins are configured to make connection to said core circuitry and a second orientation wherein the second edge faces said core circuitry and the second connection pins are configured to make connection to said core circuitry.

21. The integrated multi-directional plug-in circuit of claim 19, wherein said plurality of transistors located within the square perimeter are thin oxide transistors powered from a low voltage supply.

22. The integrated multi-directional plug-in circuit of claim 19, wherein an order and relative position of the first connection pins on the first edge corresponds to an order and relative position of the second connection pins on the second edge.

\* \* \* \* \*

UNITED STATES PATENT AND TRADEMARK OFFICE
CERTIFICATE OF CORRECTION

| | | |
|---|---|---|
| PATENT NO. | : 9,075,947 B2 | Page 1 of 1 |
| APPLICATION NO. | : 13/911224 | |
| DATED | : July 7, 2015 | |
| INVENTOR(S) | : Manoj Sharma Kumar et al. | |

It is certified that error appears in the above-identified patent and that said Letters Patent is hereby corrected as shown below:

In the Claims:

At column 10, claim number 14, line number 28, please replace the word "circuit" with the word -- the --.

Signed and Sealed this
Twenty-fourth Day of November, 2015

Michelle K. Lee
*Director of the United States Patent and Trademark Office*